(12) United States Patent
Hashimoto

(10) Patent No.: US 11,190,889 B2
(45) Date of Patent: Nov. 30, 2021

(54) SEMICONDUCTOR DEVICE AND SOUND OUTPUT DEVICE

(71) Applicant: LAPIS Semiconductor Co., Ltd., Yokohama (JP)

(72) Inventor: Takanori Hashimoto, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 135 days.

(21) Appl. No.: 16/749,835

(22) Filed: Jan. 22, 2020

(65) Prior Publication Data

US 2020/0236483 A1    Jul. 23, 2020

(30) Foreign Application Priority Data

Jan. 23, 2019    (JP) .............................. JP2019-009450

(51) Int. Cl.
*H04R 29/00*     (2006.01)
*H03G 3/30*      (2006.01)

(52) U.S. Cl.
CPC ........... *H04R 29/001* (2013.01); *H03G 3/301* (2013.01); *H04R 2430/01* (2013.01)

(58) Field of Classification Search
CPC ... H04R 29/001; H04R 2430/01; H03G 3/301
See application file for complete search history.

(56) References Cited

U.S. PATENT DOCUMENTS

| 8,421,540 | B1* | 4/2013 | Bhattacharya | .......... H03F 3/185 |
| | | | | 330/298 |
| 2006/0195720 | A1* | 8/2006 | Watts | ...................... H03F 3/217 |
| | | | | 714/11 |
| 2009/0067645 | A1* | 3/2009 | Sakai | ................... H03G 1/0094 |
| | | | | 381/107 |

FOREIGN PATENT DOCUMENTS

JP    2014230016 A    12/2014

OTHER PUBLICATIONS

Yazaki Energy System Corp, Machine Translation of description of JP 2014-230016 A, Global Dossier, pp. 1-6. (Year: 2014).*

* cited by examiner

*Primary Examiner* — Fan S Tsang
*Assistant Examiner* — Daniel R Sellers
(74) *Attorney, Agent, or Firm* — Rabin & Berdo, P.C.

(57) ABSTRACT

A semiconductor device is provided, the device including a first detection section having a removal section to remove DC offset components included in each of an input signal and an output signal output from an amplification section that amplifies the input signal, and a correction section configured to perform correction to match phases of the input signal and the output signal from which the DC offset components have been removed, and to match gains of the input signal and of the output signal, the first detection section comparing a waveform of the input signal to a waveform of the output signal, and a second detection section to detect a mismatch between the DC offset component included in the input signal that is input into the removal section and the DC offset component included in the output signal that is input into the removal section.

10 Claims, 7 Drawing Sheets

SEMICONDUCTOR DEVICE AND SOUND OUTPUT DEVICE

CROSS-REFERENCE TO RELATED APPLICATION

This application claims priority under 35 USC 119 from Japanese Patent application No. 2019-009450 filed on Jan. 23, 2019, the disclosure of which is incorporated by reference herein in its entirety.

BACKGROUND

Technical Field

The present disclosure relates to a semiconductor device and a sound output device.

Related Art

There is a known way of thinking that is generally referred to as "functional safety". This concept of functional safety relates, for example, to detecting for faults in a device based on an input signal input to the device or components included in the device and an output signal output from the device or the components thereof so as to reduce risks to within a permissible range.

An example of known technology relating to functional safety is what is referred to as reproduction sound checking technology for a sound output device that uses a speaker to reproduce an audio signal output from a sound source. This technology detects faults in the sound output device based on an audio signal output from the sound source and a signal input to the speaker.

For example, Japanese Patent Application Laid-Open (JP-A) No. 2014-230016 discloses a fault detection device configured to detect abnormalities in an amplifier of an alarm device that includes a warning sound generation means for generating a warning sound, a warning signal transmission means for transmitting a warning signal to the warning sound generation means to cause the warning sound to be generated, and an amplifier for amplifying the warning signal. The fault detection device determines abnormalities in the amplifier based on a waveform of a first detection signal output from an output terminal on the plus side of the amplifier and on a waveform of a second detection section signal output from an output terminal on the minus side of the amplifier.

An example of the technology to perform fault detection based on the waveform of signals described above is technology to compare mismatch in the waveform of respective signals such as an input signal and an output signal while the respective signals are in an aligned state in DC-offset and amplitude, and to determine the presence or absence of a fault based on the result of this comparison. However, recently demand is growing for more precise fault detection.

SUMMARY

The present disclosure provides a semiconductor device and a sound output device capable of performing more precise fault detection.

A semiconductor device according to a first aspect of the present disclosure includes a first detection section and a second detection section. The first detection section includes a removal section configured to remove DC offset components included in each of an input signal and an output signal output from an amplification section that amplifies the input signal, and a correction section configured to perform correction to match phases of the input signal and the output signal from which the DC offset components have been removed, and to match gains of the input signal and of the output signal. The first detection section is configured to compare a waveform of the input signal to a waveform of the output signal. The second detection section is configured to detect a mismatch between the DC offset component included in the input signal that is input into the removal section and the DC offset component included in the output signal that is input into the removal section.

A semiconductor device according to a second aspect of the present disclosure includes a first detection section and a second detection section. The first detection section includes a removal section configured to remove DC offset components included in each of an input signal and an output signal output from an amplification section that amplifies the input signal, and a correction section configured to perform correction to match phases of the input signal and the output signal from which the DC offset components have been removed, and to match gains of the input signal and of the output signal. The first detection section is configured to compare a waveform of the input signal to a waveform of the output signal. The second detection section is configured to detect a mismatch between the gain of the input signal that is input into the correction section and the gain of the output signal that is input into the correction section.

A sound output device of a third aspect of the present disclosure includes a sound source configured to output a sound signal, the semiconductor device of the first or second aspect, into which the sound signal is input as an input signal, and a speaker configured to output a sound corresponding to an output signal output from the semiconductor device.

The present disclosure enables more precise fault detection.

BRIEF DESCRIPTION OF THE DRAWINGS

Exemplary embodiments of the present disclosure will be described in detail based on the following figures, wherein.

DETAILED DESCRIPTION

Detailed explanation follows regarding exemplary embodiments of the present disclosure, with reference to the drawings. Note that the present disclosure is not limited to the following exemplary embodiments. In the following exemplary embodiments, an example is given in which the technology of the present disclosure is applied to an audio output device configured to output to a speaker an audio signal input from a sound source as an amplified audio signal amplified by an amplifier.

First Exemplary Embodiment

Figure 1:
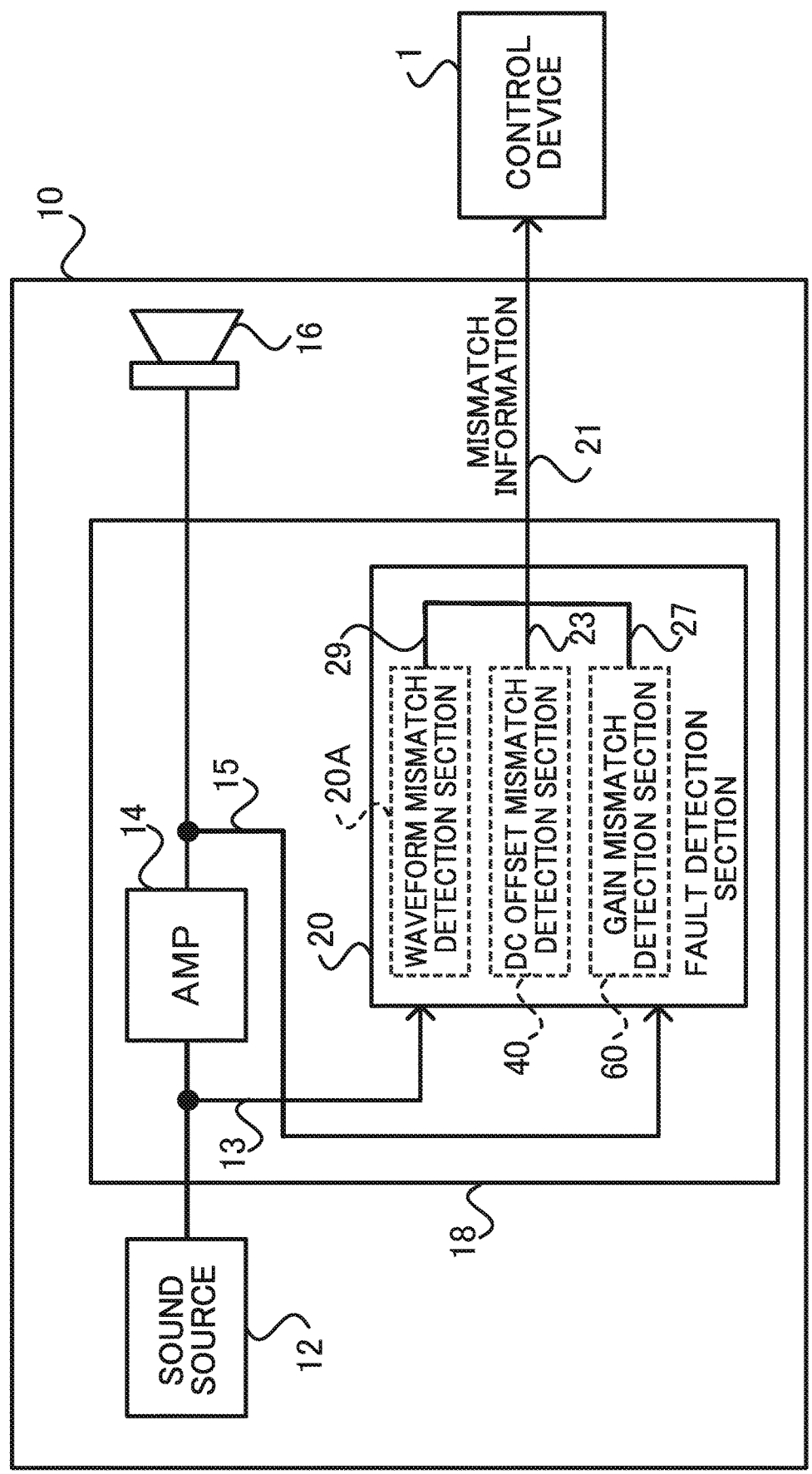
FIG. 1 is a block diagram illustrating an example of a configuration of a sound output device of a first exemplary embodiment.

First, explanation follows regarding an example of a configuration of a sound output device of the present exemplary embodiment. FIG. 1 is a block diagram illustrating an example of a configuration of a sound output device 10 of the present exemplary embodiment.

As illustrated in FIG. 1, the sound output device 10 of the present exemplary embodiment includes a sound source 12 that outputs an audio signal, a semiconductor device 18 that amplifies the audio signal output from the sound source 12, and a speaker 16 that outputs audio corresponding to the amplified audio signal. Note that the audio signal of the present exemplary embodiment is an example of a sound signal of the present disclosure.

The sound source 12 is not particularly limited as long as it includes functionality to output an audio signal to the semiconductor device 18. For example, a configuration may be adopted in which the sound source 12 is provided with a storage section to store an audio signal input from outside and audio is output from the so-provided storage section or, a configuration may be adopted in which the sound source 12 outputs the audio signal that is generated by itself. The present exemplary embodiment employs a voice as the sound output by the sound source 12, however, the sound output by the sound source 12 is obviously not limited to a human generated voice and may be another sound.

The audio signal output by the sound source 12 is input to the semiconductor device 18 through an interface, not illustrated in the drawings. The semiconductor device 18 includes an amplifier (amp) 14 and a fault detection section 20. The amp 14 includes functionality to amplify the audio signal input from the sound source 12 and to output the amplified audio signal to the speaker 16. In the following explanation, the audio signal input from the sound source 12 is referred to as a reference value signal (reference value signal 13), and the reference value signal 13 after amplification by the amp 14 is referred to as the output signal (output signal 15). Note that the reference value signal 13 of the present exemplary embodiment is an example of an input signal of the present disclosure, and the amp 14 of the present exemplary embodiment is an example of an amplification section of the present disclosure.

The fault detection section 20 includes functionality to detect mismatch between the reference value signal 13 and the output signal 15, such as a difference between the reference value signal 13 and the output signal 15. As illustrated in FIG. 1, the fault detection section 20 of the present exemplary embodiment includes a waveform mismatch detection section 20A, a direct current (DC) offset mismatch detection section 40 and a gain mismatch detection section 60. The fault detection section 20 of the present exemplary embodiment may, for example, be configured with the DC offset mismatch detection section 40 and the gain mismatch detection section 60 included in the waveform mismatch detection section 20A (see FIG. 2 etc., described in detail later).

As will be described in detail later, the waveform mismatch detection section 20A includes functionality to detect a phase difference between the waveform of the reference value signal 13 and the waveform of the output signal 15 and to detect mismatch in waveform such as distortion of the output signal 15, and to output information representing mismatch between the waveforms as waveform mismatch information 29. The DC offset mismatch detection section 40 includes functionality to output information expressing a difference between a DC offset component included in the reference value signal 13 and a DC offset component included in the output signal 15 as DC offset mismatch information 23. The gain mismatch detection section 60 includes functionality to output information expressing a difference in gain (amplitude) between the reference value signal 13 (13B) and the output signal 15 (15B) as gain mismatch information 27.

The DC offset mismatch information 23, the gain mismatch information 27, and the waveform mismatch information 29 are output as mismatch information 21 to a control device 1 external to the semiconductor device 18 through an interface, not illustrated in the drawings. The control device 1 includes functionality to determine whether or not the semiconductor device 18 is faulty based on the input mismatch information 21. Specifically, the control device 1 includes functionality to determine that the semiconductor device 18 is faulty when there is a comparatively large discrepancy between the reference value signal 13 that is the audio signal output from the sound source 12 and the output signal 15 that is the signal input to the speaker 16. An example of such a control device 1 is a micro controller unit (MCU) or the like.

Figure 2:
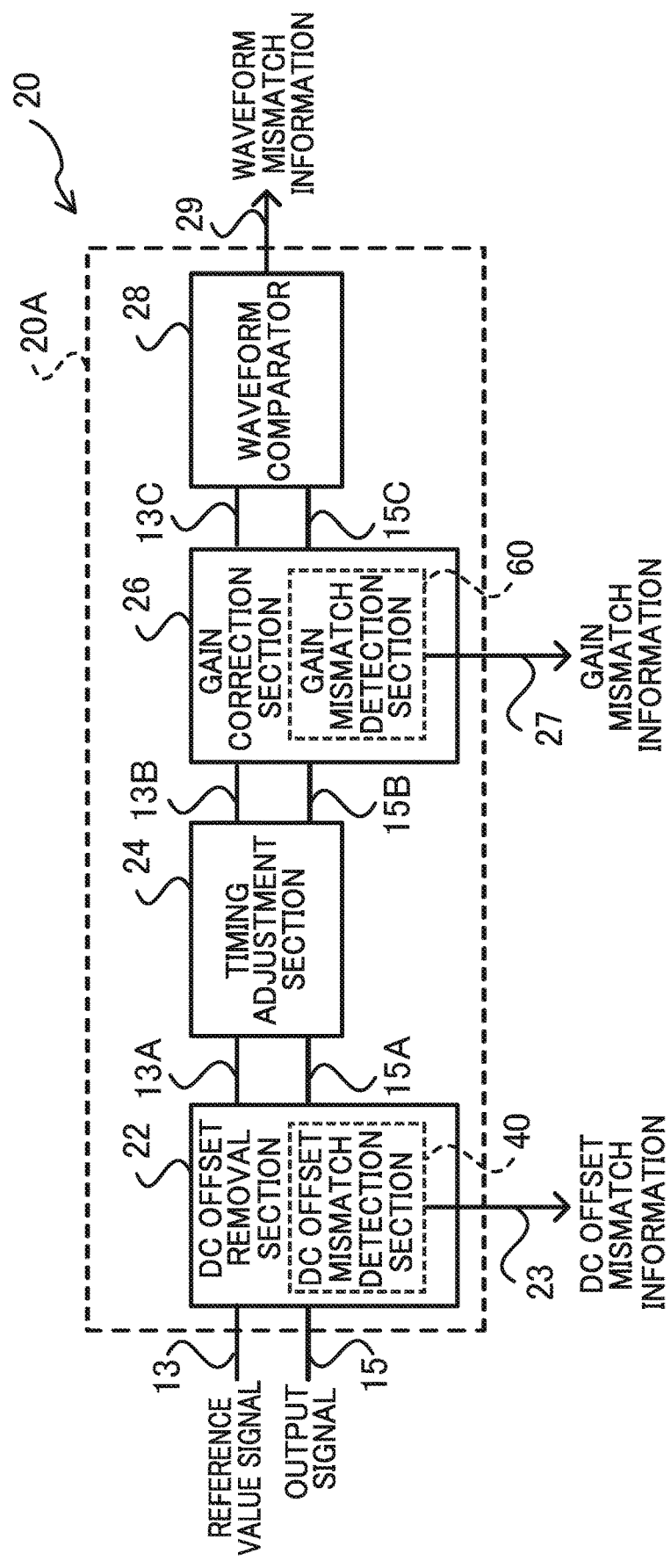
FIG. 2 is a block diagram illustrating an example of a configuration of a waveform mismatch detection section of the first exemplary embodiment.

Detailed explanation follows regarding the waveform mismatch detection section 20A, with reference to FIG. 2. FIG. 2 is a block diagram illustrating an example of a configuration of the waveform mismatch detection section 20A. As illustrated in FIG. 2, the waveform mismatch detection section 20A of the present exemplary embodiment includes a DC offset removal section 22, a timing adjustment section 24, a gain correction section 26, and a waveform comparator 28. Note that the waveform mismatch detection section 20A of the present exemplary embodiment is an example of a first detection section of the present disclosure.

The DC offset removal section 22 is input with the reference value signal 13 input from the sound source 12. The DC offset removal section 22 is also input with the output signal 15 output as feedback from the amp 14. The DC offset removal section 22 of the present exemplary embodiment includes the DC offset mismatch detection section 40.

Figure 3:
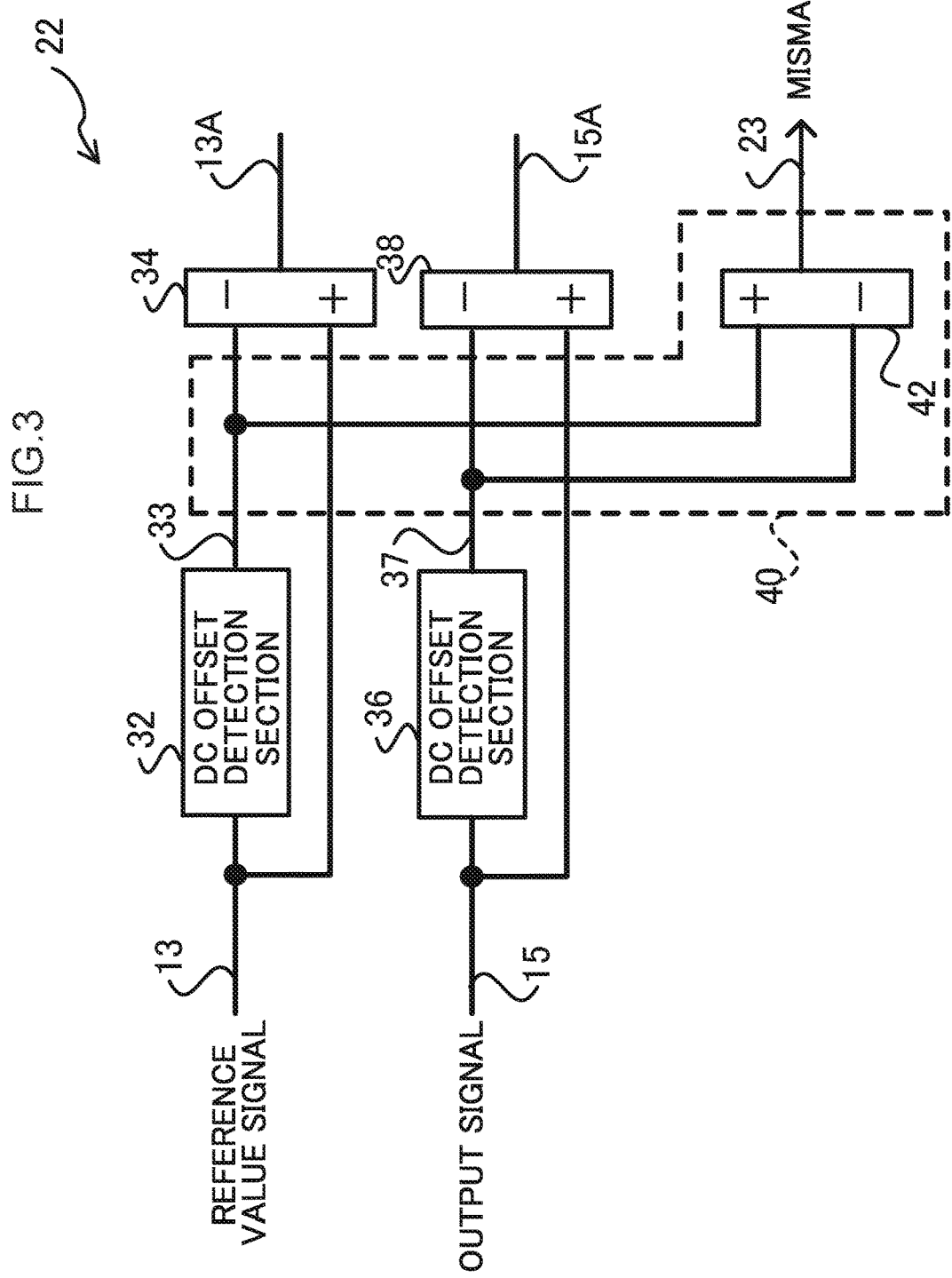
FIG. 3 is a block diagram illustrating an example of a configuration of a DC offset removal section and a DC offset mismatch detection section of the first exemplary embodiment.

FIG. 3 is a block diagram illustrating an example of a configuration of the DC offset removal section 22 and the DC offset mismatch detection section 40 of the present exemplary embodiment. As illustrated in FIG. 3, the DC offset removal section 22 of the present exemplary embodiment includes a DC offset detection section 32, a difference circuit 34, a DC offset detection section 36, and a difference circuit 38. Note that the DC offset mismatch detection section 40 of the present exemplary embodiment is an example of a second detection section of the present disclosure, and is also an example of a third detection section of the present disclosure.

The DC offset detection section 32 is input with the reference value signal 13. The DC offset detection section 32 detects a DC offset component included in the reference value signal 13, and outputs a DC offset component signal 33 representing the detected DC offset component. The difference circuit 34 is input with the reference value signal 13 and the DC offset component signal 33. The difference circuit 34 outputs a reference value signal 13A that is the difference between the reference value signal 13 and the DC offset component signal 33. In other words, the difference circuit 34 outputs the reference value signal 13A that is the reference value signal 13 from which the DC offset component has been removed.

The DC offset detection section 36 is input with the output signal 15. The DC offset detection section 36 detects a DC offset component included in the output signal 15, and outputs a DC offset component signal 37 representing the detected DC offset component. The difference circuit 38 is input with the output signal 15 and the DC offset component signal 37. The difference circuit 38 outputs an output signal 15A that is the difference between the output signal 15 and the DC offset component signal 37. In other words, the difference circuit 38 outputs the output signal 15A that is the output signal 15 from which the DC offset component has been removed.

The DC offset mismatch detection section 40 includes a difference circuit 42. The difference circuit 42 is input with the DC offset component signal 33 output from the DC offset detection section 32 and with the DC offset component signal 37 output from the DC offset detection section 36. The difference circuit 42 outputs a difference between the DC offset component signal 33 and the DC offset component signal 37 as DC offset mismatch information 23.

Sometimes there is extra DC offset not included in the reference value signal 13 superimposed on the output signal 15 due to some effect arising as a result of a fault or the like in semiconductor device 18. In the control device 1 input with the DC offset mismatch information 23, the amount of the extra DC offset superimposed on the output signal 15 can be ascertained by the DC offset mismatch information 23. As an example, in the control device 1 of the present exemplary embodiment a fault (error) is determined to have arisen when, based on the DC offset mismatch information 23, the extra DC offset amount superimposed on the output signal 15 is large, or in other words, when the amount of the DC offset component included in the output signal 15 is greatly different from the amount of the DC offset component included in the reference value signal 13.

The timing adjustment section 24 is input with the reference value signal 13A and the output signal 15A output from the DC offset removal section 22. The timing adjustment section 24 adjusts the timings of the reference value signal 13A and the output signal 15A, and outputs a timing-adjusted reference value signal 13B and a timing-adjusted output signal 15B. Specifically, the timing adjustment section 24 adjusts timings to match phase in the reference value signal 13A and the output signal 15A.

The gain correction section 26 is input with the reference value signal 13B and the output signal 15B output from the timing adjustment section 24. The gain correction section 26 of the present exemplary embodiment includes a gain mismatch detection section 60.

Figure 4:
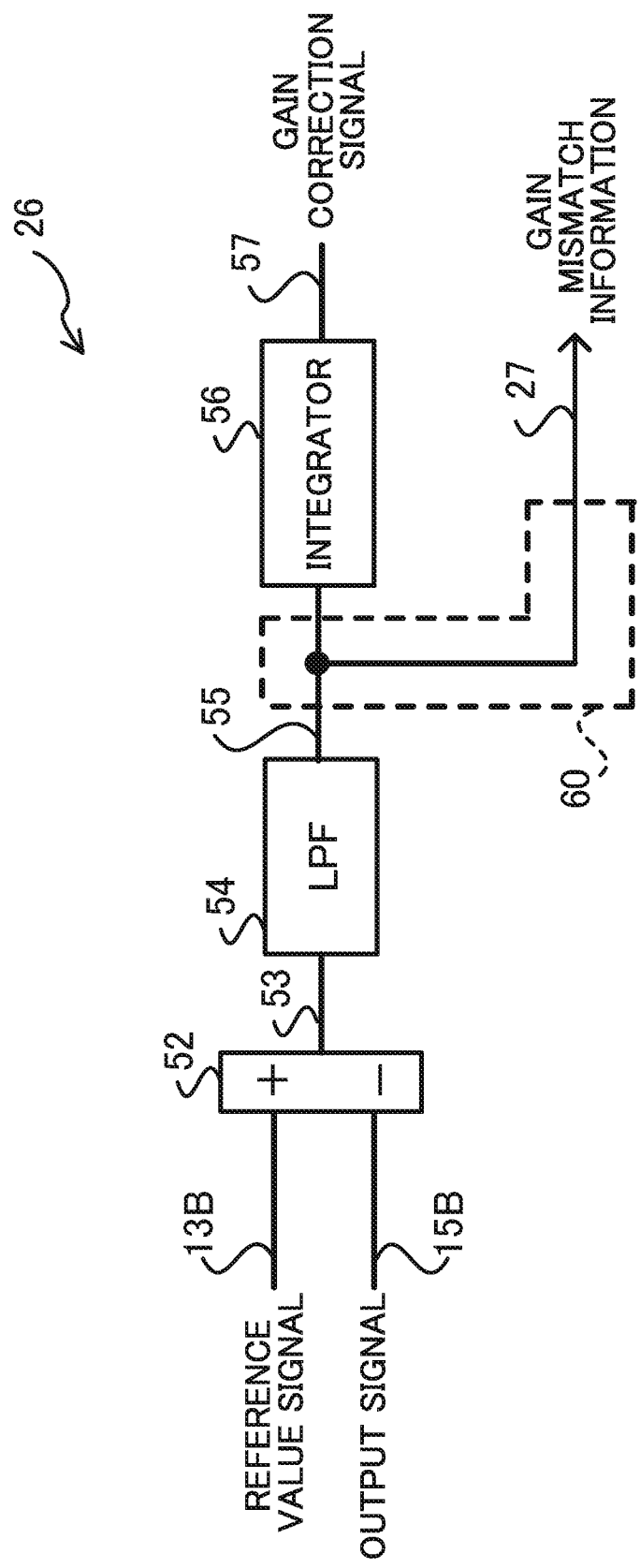
FIG. 4 is a block diagram illustrating an example of a configuration of a gain correction section and a gain mismatch detection section of the first exemplary embodiment.

FIG. 4 is a block diagram illustrating an example of configurations of the gain correction section 26 and the gain mismatch detection section 60 of the present exemplary embodiment. As illustrated in FIG. 4, the gain correction section 26 of the present exemplary embodiment includes a difference circuit 52, a low pass filter (LPF) 54, and an integrator 56. Note that the gain mismatch detection section 60 of the present exemplary embodiment is an example of a third detection section of the present disclosure, and is also an example of a second detection section of the present disclosure.

The difference circuit 52 is input with the reference value signal 13B and the output signal 15B output from the timing adjustment section 24. The difference circuit 52 outputs a difference signal 53 representing a difference between the reference value signal 13B and the output signal 15B. Specifically, the difference circuit 52 outputs as the difference signal 53 a difference in amplitude between the reference value signal 13B and the output signal 15B. The LPF 54 is input with the difference signal 53. The LPF 54 outputs a difference smoothing signal 55 that is the difference signal 53 after being smoothed. Noise is excluded from the difference smoothing signal 55 by the difference signal 53 being smoothed by the LPF 54.

The integrator 56 is input with the difference smoothing signal 55. The integrator 56 integrates the input difference smoothing signal 55. In other words, the integrator 56 outputs a gain correction signal 57 representing a correction amount required to match the amplitudes of the reference value signal 13B and the output signal 15B by feedback and addition of the difference smoothing signal 55.

The gain correction section 26 uses a correction circuit, not illustrated in the drawings, to correct gain of the output signal 15B with the gain correction signal 57 output from the integrator 56, thereby matching the amplitude of the reference value signal 13B with the amplitude of the output signal 15B. The gain correction section 26 outputs a reference value signal 13C and an output signal 15C in a state in which their respective amplitudes are matched with each other.

The gain mismatch detection section 60 outputs the difference smoothing signal 55 as the gain mismatch information 27. Sometimes gain of the reference value signal 13 (13B) and gain of the output signal 15 (15B) differ (are mismatched) greatly due to some effect arising due to a fault or the like in the semiconductor device 18. In the control device 1 input with the gain mismatch information 27, an amount of mismatch between the gain of the reference value signal 13 and the gain of the output signal 15 can be ascertained using the gain mismatch information 27. As an example, in the control device 1 of the present exemplary embodiment, based on the gain mismatch information 27 a fault (error) is determined to have occurred when there is a large amount of mismatch in gain between the gain of the reference value signal 13 and the gain of the output signal 15.

The waveform comparator 28 is input with the reference value signal 13C and the output signal 15C output from the gain correction section 26. The waveform comparator 28 compares the waveform of the reference value signal 13C against the waveform of the output signal 15C, and outputs as a comparison result the waveform mismatch information 29 representing distortion or the like in the waveform of the output signal 15C as mismatch in the waveform of the output signal 15C with respect to the waveform of the reference value signal 13C.

In the waveform mismatch detection section 20A such as that of the present exemplary embodiment, mismatch between the waveform of the reference value signal 13 (13C) and the waveform of the output signal 15 (15C) is detected in a state in which DC offset mismatch has been removed in both the reference value signal 13 and the output signal 15 and in which, furthermore, the timings and amplitudes thereof have been matched.

Sometimes there is a mismatch between the waveform of the output signal 15 and the waveform of the reference value signal 13 due to the waveform of the output signal 15 being distorted or the like by a fault or the like arising in the semiconductor device 18. In the control device 1 input with the waveform mismatch information 29, the waveform mismatch information 29 can be employed to ascertain mismatch between the waveform of the output signal 15 and the waveform of the reference value signal 13. As an example, in the control device 1 of the present exemplary embodiment, based on the waveform mismatch information 29 a fault (error) is determined to have arisen when there is a large mismatch between the waveform of the output signal 15 and the waveform of the reference value signal 13.

Figure 5:
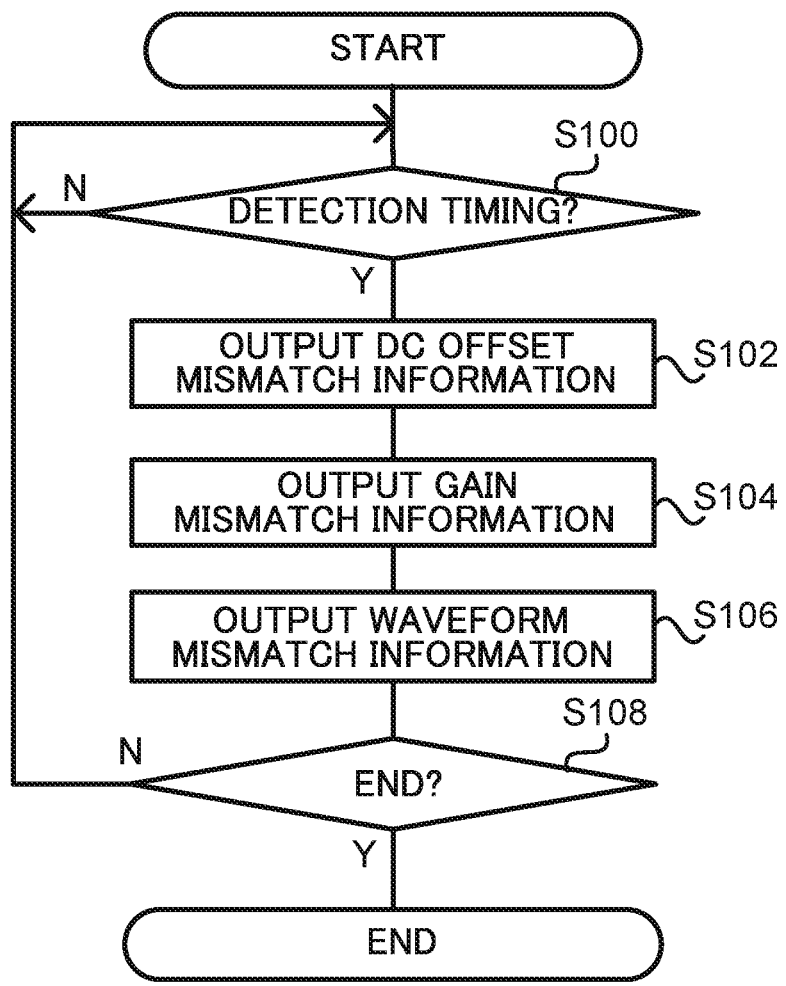
FIG. 5 is a flowchart illustrating an example of processing to detect mismatch information executed by a semiconductor device according to the first exemplary embodiment.

Explanation next follows regarding operation of the semiconductor device 18 of the present exemplary embodiment. FIG. 5 is a flowchart illustrating an example of processing to detect mismatch information 21 executed by the semiconductor device 18. As an example, in the present exemplary embodiment the detection processing illustrated in FIG. 5 is executed when power is turned ON to the semiconductor device 18.

At step S100, the fault detection section 20 determines whether or not a timing to detect the mismatch information 21 has been reached. The timing to detect the mismatch information 21 is not particularly limited, and may, for example, be every predetermined interval, may be as required, or may be a timing related to a timing of input of an audio signal (reference value signal 13) from the sound source 12.

Negative determination is determined at step S100 until the timing to detect the mismatch information 21 is reached. Affirmative determination is determined at step S100 when the mismatch information 21 detection timing has been reached, and processing transitions to step S102.

At step S102, the DC offset mismatch detection section 40 outputs the DC offset mismatch information 23 as described above. The DC offset mismatch information 23 output from the DC offset mismatch detection section 40 is output to the control device 1 as the mismatch information 21.

At the next step S104, the gain mismatch detection section 60 outputs the gain mismatch information 27 as described above. The gain mismatch information 27 output by the gain mismatch detection section 60 is output to the control device 1 as the mismatch information 21.

At the next step S106, the waveform mismatch detection section 20A outputs the waveform mismatch information 29 as described above. The waveform mismatch information 29 output by the waveform mismatch detection section 20A is output to the control device 1 as the mismatch information 21.

At the next step S108, the fault detection section 20 determines whether or not to end the detection processing. As an example, in the semiconductor device 18 of the present exemplary embodiment, negative determination is determined at step S108 until the power is turned OFF, processing returns to step S100, and the detection processing is repeated. Affirmative determination is determined at step S108 when the power of the semiconductor device 18 has been turned OFF, and the present detection processing is ended.

In this manner, in the fault detection section 20 of the sound output device 10 of the present exemplary embodiment, the DC offset mismatch information 23, the gain mismatch information 27, and the waveform mismatch information 29 are output in this sequence and sequentially input to the control device 1. The control device 1 accordingly enables sequential determination as to whether or not a fault (error) has arisen in the DC offset, determination as to whether or not a fault (error) has arisen in the gain, and determination as to whether or not a fault (error) has arisen for the waveform.

Second Exemplary Embodiment

Explanation follows regarding a sound output device 10 of an exemplary embodiment, with reference to the drawings. Note that the sound output device 10 of the present exemplary embodiment includes configuration similar to that of the sound output device 10 of the first exemplary embodiment (see FIG. 1), and so such similar configuration will be noted, and detailed explanation thereof omitted.

Figure 6:
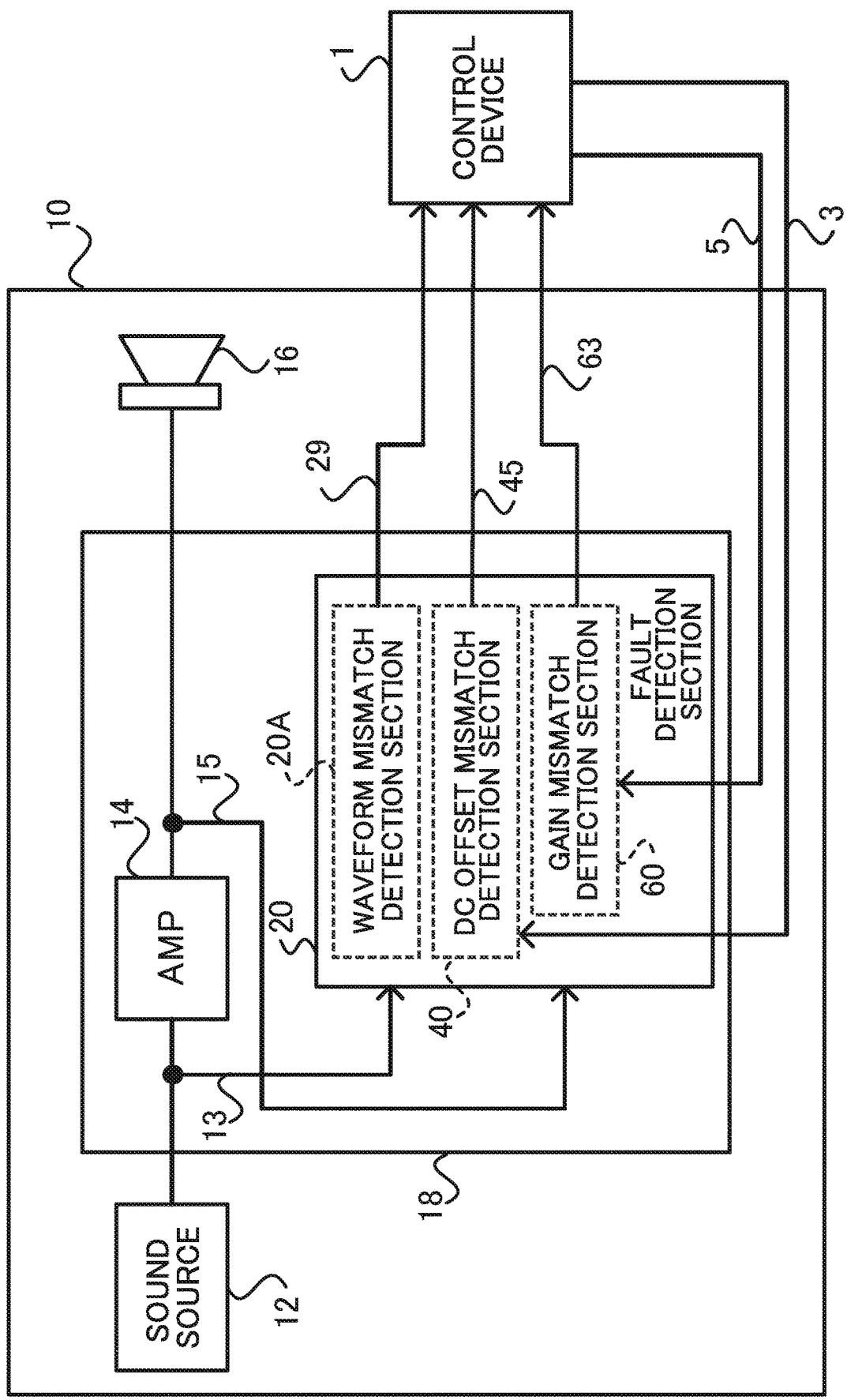
FIG. 6 is a block diagram illustrating an example of a configuration of a sound output device of a second exemplary embodiment.

FIG. 6 is a block diagram illustrating an example of a configuration of the sound output device 10 of the present exemplary embodiment. As illustrated in FIG. 6, the overall configuration of the sound output device 10 is similar to that of the first exemplary embodiment, except in the configuration of the fault detection section 20 of the semiconductor device 18.

As illustrated in FIG. 6, similarly to in the waveform mismatch detection section 20A of the first exemplary embodiment, waveform mismatch information 29 is output from the waveform mismatch detection section 20A of the fault detection section 20 of the present exemplary embodiment, and is input to the control device 1 through an interface, not illustrated in the drawings.

As illustrated in FIG. 6, the DC offset mismatch detection section 40 of the present exemplary embodiment differs from the DC offset mismatch detection section 40 of the first exemplary embodiment in the point that a fault detection threshold value 3 output from the control device 1 is input thereto through an interface, not illustrated in the drawings. The DC offset mismatch detection section 40 also differs from the DC offset mismatch detection section 40 of the first exemplary embodiment in the point that instead of the DC offset mismatch information 23, fault information 45 indicating that a fault (error) is occurring for DC offset is output from the DC offset mismatch detection section 40, and input to the control device 1 through an interface, not illustrated in the drawings. The DC offset mismatch detection section 40 employs the fault detection threshold value 3 to determine whether or not there is a fault for DC offset, and outputs this determination result as the fault information 45.

Moreover, as illustrated in FIG. 6, the gain mismatch detection section 60 of the present exemplary embodiment differs from the gain mismatch detection section 60 of the first exemplary embodiment in the point that a fault detection threshold value 5 output from the control device 1 is input thereto through an interface, not illustrated in the drawings. The gain mismatch detection section 60 also differs from the gain mismatch detection section 60 of the first exemplary embodiment in the point that instead of the gain mismatch information 27, fault information 63 indicating that a fault (error) is occurring for gain is output from the gain mismatch detection section 60 and input to the control device 1 through an interface, not illustrated in the drawings. The gain mismatch detection section 60 employs the fault detection threshold value 5 to determine whether or not there is a fault for gain, and outputs this determination result as the fault information 63.

Figure 7:
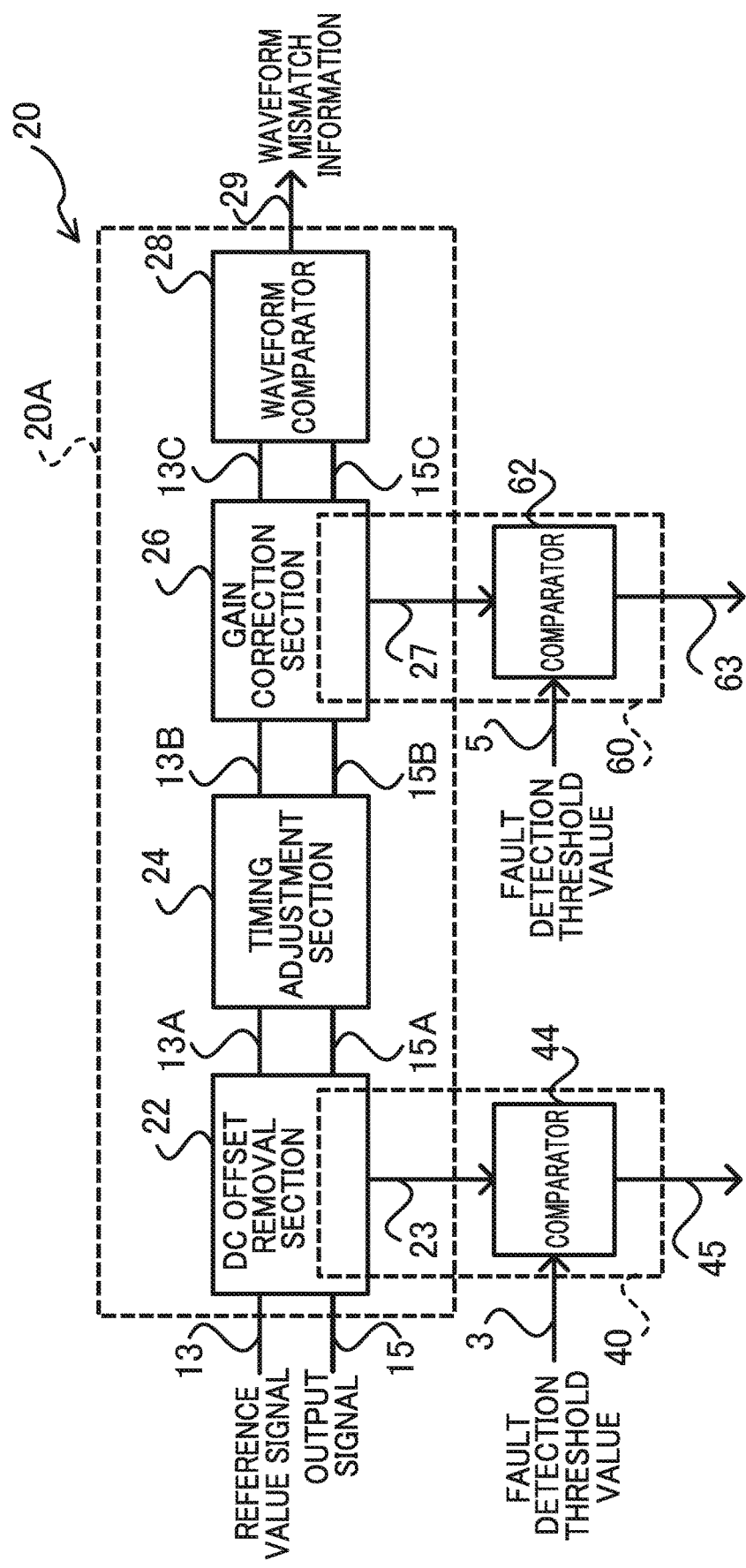
FIG. 7 is a block diagram illustrating an example of a configuration of a waveform mismatch detection section, a DC offset mismatch detection section, and a gain mismatch detection section of the second exemplary embodiment.

FIG. 7 is a block diagram illustrating an example of a configuration of the waveform mismatch detection section 20A, the DC offset mismatch detection section 40, and the gain mismatch detection section 60.

As illustrated in FIG. 7, the DC offset mismatch detection section 40 of the present exemplary embodiment includes a comparator 44. The comparator 44 of the present exemplary embodiment is an example of a comparator for second detection section use of the present disclosure, and is also an example of a comparator for third detection section use of the present disclosure. Note that FIG. 7 omits illustration of configuration of the DC offset mismatch detection section 40 that is included in the DC offset removal section 22 described above, namely configurations to output the DC offset mismatch information 23.

The comparator 44 is input with the DC offset mismatch information 23 and the fault detection threshold value 3. Sometimes, even if there is a difference between the DC offset component signal 33 from the reference value signal 13 and the DC offset component signal 37 from the output signal 15, this difference is actually within a permissible range for the sound output device 10. Accordingly, a value of difference that would not be permissible in the sound output device 10 is set as the fault detection threshold value 3 in the sound output device 10 of the present exemplary embodiment. A fault (error) for DC offset is deemed to be occurring when a difference between the DC offset component signal 33 and the DC offset component signal 37 has exceeded the fault detection threshold value 3.

The comparator 44 outputs the fault information 45 when the amount of mismatch in DC offset as expressed by the DC offset mismatch information 23 has exceeded the fault detection threshold value 3. The control device 1 is accordingly able to determine that a fault (error) is occurring for DC offset when the fault information 45 has been input.

As illustrated in FIG. 7, the gain mismatch detection section 60 of the present exemplary embodiment includes a comparator 62. The comparator 62 of the present exemplary embodiment is an example of a comparator for third detection section use of the present disclosure, and is also an example of a comparator for second detection section use of the present disclosure. Note that FIG. 7 omits illustration of configuration of the gain mismatch detection section 60 that is included in the gain correction section 26 described above, namely configuration to output the gain mismatch information 27.

The comparator 62 is input with the gain mismatch information 27 and the fault detection threshold value 5. Sometimes, even if there is a difference between the gain of the reference value signal 13B and the gain of the output signal 15B, this difference is actually within a permissible range for the sound output device 10. Accordingly, a value of difference that would not be permissible in the sound output device 10 is set as the fault detection threshold value 5 of the sound output device 10 of the present exemplary embodiment. A fault is determined to have arisen for gain when a difference between the gain of the reference value signal 13B and the gain of the output signal 15B has exceeded the fault detection threshold value 5.

The comparator 62 outputs the fault information 63 in cases in which the amount of difference in the gain as expressed by the gain mismatch information 27 has exceeded the fault detection threshold value 5. The control device 1 is accordingly able to determine that a fault (error) has arisen for gain when the fault information 63 has been input.

In the semiconductor device 18 of the present exemplary embodiment, the fault information 45 is output instead of the DC offset mismatch information 23, enabling notification to be made to the control device 1 of whether or not a fault (error) has arisen for DC offset, instead of notifying the amount of mismatch (difference) in the DC offset. Moreover, in the semiconductor device 18 of the present exemplary embodiment, the fault information 63 is output instead of the gain mismatch information 27, enabling the control device 1 to be notified of whether or not a fault (error) has arisen for gain, instead of notifying the amount of mismatch (difference) in the gain.

As described above, the semiconductor device 18 of the exemplary embodiments described above includes the waveform mismatch detection section 20A. The waveform mismatch detection section 20A includes the DC offset removal section 22 configured to remove the DC offset components respectively included in the output signal 15 output from the amp 14 that amplifies the reference value signal 13 and in the reference value signal 13, and the gain correction section 26 configured to perform correction to match phase in the reference value signal 13A and the output signal 15A, from which the DC offset components have been removed, using the timing adjustment section 24 and to match the gains of the reference value signal 13B and the output signal 15B. The waveform mismatch detection section 20A is configured to compare the waveform of the reference value signal 13C to the waveform of the output signal 15C using the waveform comparator 28. The semiconductor device 18 of the exemplary embodiments described above further includes the DC offset mismatch detection section 40 configured to detect mismatch between the DC offset component included in the reference value signal 13 for input to the DC offset removal section 22 and the DC offset component included in the output signal 15 for input to the DC offset removal section 22. The semiconductor device 18 of the exemplary embodiments described above further includes the gain mismatch detection section 60 configured to detect mismatch between gain of the reference value signal 13B for input to the gain correction section 26 and gain of the output signal 15B for input to the gain correction section 26.

Accordingly, in the semiconductor device 18 of the exemplary embodiments described above, in addition to mismatch between the waveform of the reference value signal 13 and the waveform of the output signal 15, the DC offset mismatch detection section 40 detects the difference between the DC offset component included in the reference value signal 13 and the DC offset component included in the output signal 15. The semiconductor device 18 of the present exemplary embodiment accordingly ascertains whether or not a fault (error) has arisen for DC offset from the DC offset mismatch information 23 expressing the difference in the detected DC offsets. Since the control device 1 is capable of determining whether or not there is a fault (error) from the DC offset mismatch information 23 output before the waveform mismatch information 29, the control device 1 is capable of determining whether or not there is a fault (error) more quickly than in a configuration in which determination as to whether or not there is a fault (error) using the waveform mismatch information 29.

In the semiconductor device 18 of the exemplary embodiments described above, in addition to mismatch between the waveform of the reference value signal 13 and the waveform of the output signal 15, the gain mismatch detection section 60 detects the difference between the gain of the reference value signal 13 and the gain of the output signal 15. The semiconductor device 18 of the present exemplary embodiment accordingly determines whether or not a fault (error) has arisen for gain from the gain mismatch information 27 expressing the difference in the detected gains. Since the control device 1 is capable of determining whether or not there is a fault (error) from the gain mismatch information 27 output before the waveform mismatch information 29, the control device 1 is capable of determining whether or not there is a fault (error) more quickly than in a configuration in which whether or not there is a fault (error) is determined from the waveform mismatch information 29.

The semiconductor device 18 of the exemplary embodiments described above is thus capable of performing more precise fault detection.

Although explanation has been given in the exemplary embodiments described above regarding examples in which the technology of the present disclosure is applied to checking reproduction sound, namely to the sound output device 10, the technology of the present disclosure is not limited to the sound output device 10, and is applicable to any system for detecting a discrepancy between two signals.

Note that the waveform mismatch detection section 20A may include functionality to remove DC offset components included in the output signal 15 and the reference value signal 13 output from the amp 14 that amplifies the reference value signal 13, and to compare waveforms in a state in which the phase and gain thereof have been matched. Although explanation has been given in the exemplary embodiments described above regarding configurations in which the waveform mismatch detection section 20A of the semiconductor device 18 includes respective circuit blocks for the DC offset removal section 22, the timing adjustment section 24, the gain correction section 26, and the waveform comparator 28, there is no limitation to implementing the functionality of each section using circuit blocks.

Although explanation has been given in the exemplary embodiments described above regarding a configuration in which the control device 1 includes functionality to determine whether or not there is a fault in the semiconductor device 18, a configuration may be adopted in which some or all of this functionality is provided to the sound output device 10. Moreover, although explanation has been given in the exemplary embodiments described above regarding a configuration in which the sound output device 10 includes the DC offset mismatch detection section 40 and the gain mismatch detection section 60, obviously configuration may be made in which only one of these sections is provided.

There are no particular limitations to the specific hardware configuration of the semiconductor device 18 of the exemplary embodiments described above. For example, the fault detection section 20 may be configured by a single chip, or may be configured by a combination of plural chips.

The configuration and operation of the sound output device 10 and the semiconductor device 18 etc. in the exemplary embodiments described above are merely examples thereof, and obviously various modifications may be implemented according to circumstances within a range not departing from the spirit of the present disclosure.

What is claimed is:

1. A semiconductor device comprising:
  a first detection section including:
    a removal section configured to remove DC offset components included in each of an input signal and an output signal output from an amplification section that amplifies the input signal, and
    a correction section configured to perform correction to match phases of the input signal and the output signal from which the DC offset components have been removed, and to match gains of the input signal and of the output signal,
    the first detection section being configured to compare a waveform of the input signal to a waveform of the output signal; and
  a second detection section configured to detect a mismatch between the DC offset component included in the input signal that is input into the removal section and the DC offset component included in the output signal that is input into the removal section.

2. The semiconductor device of claim 1, further comprising a third detection section configured to detect a mismatch between gain of the input signal that is input into the correction section and gain of the output signal that is input into the correction section.

3. A semiconductor device of claim 2, further commprising a comparator that compares an amount of the mismatch detected by the third detection section against a predetermined fault detection threshold value.

4. The semiconductor device of claim 1, further comprising a comparator that compares an amount of the mismatch detected by the second detection section against a predetermined fault detection threshold value.

5. A sound output device comprising:
  a sound source configured to output a sound signal;
  the semiconductor device of claim 1, into which the sound signal is input as an input signal; and
  a speaker configured to output a sound corresponding to an output signal output from the semiconductor device.

6. The semiconductor device comprising:
  a first detection section including:
    a removal section configured to remove DC offset components included in each of an input signal and an output signal output from an amplification section that amplifies the input signal, and
    a correction section configured to perform correction to match phases of the input signal and the output signal from which the DC offset components have been removed, and to match gains of the input signal and of the output signal,
    the first detection section being configured to compare a waveform of the input signal to a waveform of the output signal; and
  a second detection section configured to detect mismatch between the gain of the input signal that is input into the correction section and the gain of the output signal that is input into the correction section.

7. The semiconductor device of claim 6, further comprising a third detection section configured to detect a mismatch between the DC offset component inluded in the iput signal that is input into the removal section and the DC offset component inlcuded in the output signal that is input into the removal section.

8. The semiconductor device of claim 7, further comprising a comparator that compares an amount of the mismatch detected by the third detection section against a predetermined fault detection threshold value.

9. The semiconductor device of claim 6, further comprising a comparator that compares an amount of the mismatch detected by the second detection section against a predetermined fault detection threshold value.

10. A sound output device comprising:
  a sound source configured to output a sound signal;
  the semiconductor device of claim 6, into which the sound signal is input as an input signal; and
  a speaker configured to output a sound corresponding to an output signal output from the semiconductor device.

* * * * *